(12) United States Patent
Xu

(10) Patent No.: US 7,239,259 B1
(45) Date of Patent: Jul. 3, 2007

(54) DIGITIZER WITH ENHANCED ACCURACY

(75) Inventor: Fang Xu, Newton, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/318,252

(22) Filed: Dec. 23, 2005

(51) Int. Cl.
*H03M 1/12* (2006.01)

(52) U.S. Cl. ..................... 341/155; 341/156
(58) Field of Classification Search ............... 341/155, 341/156, 157
See application file for complete search history.

(56) References Cited

U.S. PATENT DOCUMENTS 4,181,967 A * 1/1980 Nash et al. ................. 708/311
5,490,099 A * 2/1996 Shou et al. ..................... 708/7

* cited by examiner

*Primary Examiner*—Brian Young
(74) *Attorney, Agent, or Firm*—Fish & Richardson P.C.

(57) ABSTRACT

Systems and techniques for converting an analog input signal to a digital code are described. A system includes a differential stage to produce a sign bit indicative of a sign of the analog input signal and to generate a first analog signal that is approximately equal to an absolute value of the analog input signal. The system also includes an analog-to-digital converter (ADC) to convert the first analog signal to a second digital code representing a magnitude of the analog input signal and a controller to combine the second digital code and the sign bit to produce a first digital code.

20 Claims, 4 Drawing Sheets

DIGITIZER WITH ENHANCED ACCURACY

TECHNICAL FIELD

This patent application relates to improving the performance of an analog-to-digital converter, and more particularly to improving its accuracy and dynamic range.

BACKGROUND

A bipolar analog-to-digital converter (ADC) converts an analog input signal to a digital output code that can represent both positive and negative values. Although there are different ways to represent a negative number as a digital code, most representations use the most significant bit (MSB) of the code to signify whether the represented value is positive or negative. The MSB is sometimes referred to as a "sign bit". Examples of binary representations of negative numbers include a one's complement representation and a two's complement representation.

The transfer function of an ADC is a plot of the code generated at the ADC output as function of the input signal value. Such a plot is not continuous but is a plot of $2^N$ steps, where N the number of bits in the digital output. For an ideal ADC, a single straight line can be drawn through the points at each code-transition boundary, beginning at the origin of the plot.

Figure 1:
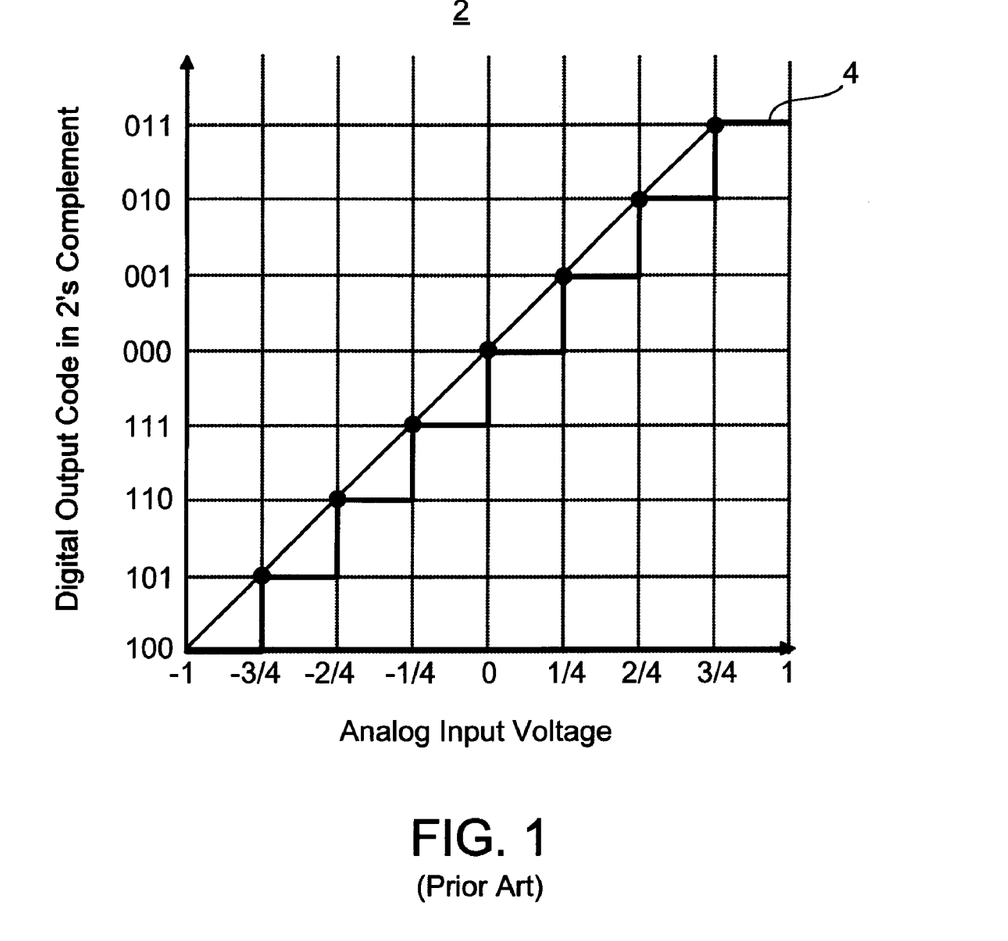
FIG. 1 shows a plot of an ideal transfer function of an analog-to-digital converter (ADC) that represents negative and positive values as two's complement binary codes.

FIG. 1 shows a plot 2 of an ideal transfer function 4 for a 3-bit ADC with reference points at code transition boundaries. The ADC in this example produces a total of eight steps that each represents a value of the analog input signal as a two's complement binary code. In this case, the MSB (i.e., the first bit of each code) signifies whether the code represents a negative or a positive value. For example, all of the digital codes having an MSB equal to "1" represent negative values, and all of the digital codes having an MSB equal to "0" represent either a positive value or zero. The transition occurs at one code width, which is equal to a least significant bit (LSB). The actual value of an LSB is equal to $V_{ref}/2^{(N-1)}$, where $V_{ref}$ is the reference voltage that determines the full-scale range of the ADC (i.e., the range of analog input values that ADC can convert to digital values). The resolution of the ADC, which determines the best accuracy to which the ADC can represent an analog input value, is equal to the value of the LSB. In the example shown in FIG. 1, the resolution is $V_{ref}/4$.

SUMMARY

The invention provides methods and systems, including computer program products, for converting an analog input signal to a digital code.

In general, in one aspect, the invention features a system that includes a differential stage to produce a sign bit indicative of a sign of the analog input signal and to generate a first analog signal that is approximately equal to an absolute value of the analog input signal. The system also includes an analog-to-digital converter (ADC) to convert the first analog signal to a second digital code representing a magnitude of the analog input signal and a controller to combine the second digital code and the sign bit to produce a first digital code.

In general, in another aspect, the invention features a method for converting an analog input signal to a first digital code. Using a differential stage, a sign bit indicative of the sign of the analog input signal is produced and a first analog signal that is approximately equal to the absolute value of the analog input signal is generated. Using an analog-to-digital converter (ADC) the first analog signal is converted to a second digital code representing the magnitude of the analog input signal. Using a controller coupled to the differential stage and the ADC, the second digital code and the sign bit are combined to produce the first digital code.

Embodiments may include one or more of the following. The sign bit may be a most significant bit of the first digital code, and the first digital code can represent both positive and negative values of the analog input signal. For example, the first digital code may be one of a one's complement representation and a two's complement representation. A voltage buffer coupled between the differential stage and the ADC, in which the voltage buffer is configured to provide an output impedance that is less than an input impedance of the ADC, may be provided.

The differential stage may include a differential pair that includes a first transistor and a second transistor. A first applied voltage that is substantially equal to the analog input signal may be applied to the base of the first transistor and a second applied voltage that is substantially equal in magnitude and opposite in sign to the analog input signal may be applied to the base of the second transistor. The collectors of the first and second transistor may be configured to conduct current when the first and second applied voltage are greater than a threshold voltage (e.g., zero) and the sum of currents conducted by the collectors of the first and second transistors is constant. The differential stage may also include a differential to single-ended converter to select a value of the sign bit in response to detecting a current flowing through one of the collectors of the first and second transistors. For example, the differential to single-ended converter may be configured to select the value of the sign bit to indicate that the analog input signal is positive in response to detecting a current flowing through the collector of the first transistor and select the value of the sign bit to indicate that the analog input signal is negative in response to detecting a current flowing through the collector of the second transistor.

The emitters of the first and second transistor may produce voltages that follow the first and second applied voltages, respectively, when the collectors of the first and second transistor conduct current. The emitters of the first and second transistors may also be connected at a node that carries the first analog signal that is approximately equal to the absolute value of the analog input signal and that includes voltages produced at the emitters of the first and second transistors. A current source (e.g., a current mirror) may be coupled to the emitters of the first and second transistors.

Third and fourth transistors configured to reduce a Miller effect of a parasitic capacitance between the base and the collector of the first and second transistors, respectively, may be provided. For example, the third and fourth transistors may receive fixed voltages at their bases, and their collectors may be coupled to a voltage supply. The emitter of the third transistor may be connected to the collector of the first transistor, and the emitter of the fourth transistor may be connected to the collector of the second transistor.

The details of one or more embodiments of the invention are set forth in the accompanying drawings and the description below. Other features, objects, and advantages of the invention will be apparent from the description and drawings, and from the claims.

DETAILED DESCRIPTION

Testing equipment for characterizing the performance of various electronic devices often includes one or more ADCs. For testing some state-of-the-art devices, the best available ADCs at the time the testing equipment is designed may not have sufficient resolution and dynamic range. Replacing the ADCs with those having improved resolution and dynamic range may be prohibitively expensive and/or require modifications to other parts of the testing equipment.

Figure 2:
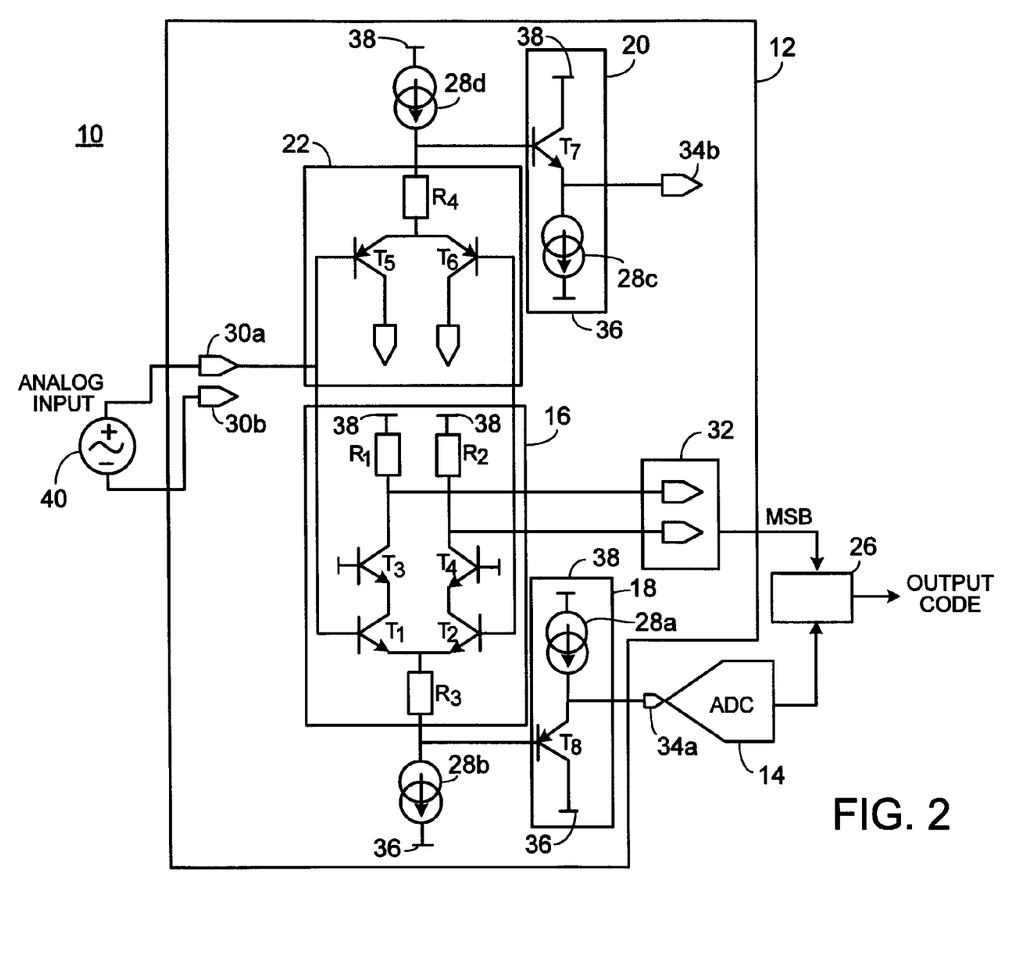
FIG. 2 shows a schematic diagram of a composite ADC that includes an external differential stage for providing a sign bit.

FIG. 2 shows a composite ADC 10 that can improve resolution and dynamic range of an N-bit ADC 14 by adding an extra bit to the output of an existing ADC 14 to produce an overall output having N+1 bits. In addition to the ADC 14, the composite ADC 10 includes an external differential stage 12 coupled to the ADC 14, and a processor 26 coupled to the ADC 14 and the differential stage 12. A differential to single-ended converter 32 within the differential stage 12 produces a sign bit indicative of the sign of an analog input signal received at an input pin 30a. The input pin 30a is connected to the positive terminal of an analog voltage source and the input pin 30b is connected to the negative terminal of the source and therefore receives a negated version of the analog input signal. At output pins 34a–b, the differential stage 12 produces an analog signal that is equal to the absolute value of the analog input signal. This signal is received from output pin 34a by the ADC 14, which in turn converts the absolute value to a digital code. The processor 26 then combines the sign bit generated by the differential to single-ended converter 32 and the digital code produced by the ADC 14 to yield an overall N+1-bit output code that represents the analog input. The sign bit is the MSB of the overall output code. The overall output code may conform to any format that can represent both negative and positive values. Examples of formats include one's complement and two's complement representations. As will be discussed in more detail below, because the ADC 14 converts only positive analog values, the codes that a conventional ADC would have used to represent negative numbers are used by the ADC 14 to represent positive values. As a result, the resolution of the composite ADC 10 is doubled without reducing its dynamic range below that of the conventional ADC. Alternatively, the dynamic range of the ADC 14 can be half of that of a conventional ADC yet the composite ADC 10 will still exhibit the same dynamic range as the conventional ADC because the differential stage 12 supplies an extra bit.

In addition to the input pins 30a–b, to the differential to single-ended converter 32, and to the output pins 34a–b, the differential stage 12 includes a differential pair 16 that extracts the sign of the input analog signal; voltage followers 18, 20, and 22; multiple current sources 28a–d (referred to collectively as "current sources 28"), a dc power supply 38, and ground pins 36 connected to ground. All of the transistors shown in FIG. 2 are bipolar-junction transistors (BJTs). It is possible to replace the BJTs in this application by field effect transistors (FET).

The differential pair 16 has two functions: it extracts the sign of the analog input signal 40 and produces the absolute value of the analog input 40 as an input to the ADC 14. It includes a pair of telescopic cascodes. The first telescopic cascode includes two npn transistors T1 and T3 and a resistor R1, and the second telescopic cascode includes two npn bipolar transistors T2 and T4 and a resistor R2. The input pins 30a and 30b are connected to opposite polarities of an analog voltage source and to the respective bases of transistors T1 and T2. The positive polarity of the analog source 40, which generates the analog input signal, is received at the base of transistor T1 and the negative polarity of the source, which generates a signal that is equal in magnitude but opposite in sign to the analog input signal, is received at the base of transistor T2. The voltages at the bases of transistors T3 and T4 are fixed to a DC bias circuit (not shown) that are derived from the dc power supply 38.

The circuit that includes transistors T1 and T2 is a trans-impedance linear amplifier. So the current will change smoothly. When the input voltage varies, the base current of both transistors T1 and T2 vary. The base current variation is proportional to voltage variation. As a result, the collector currents of the transistors T1 and T2 will also vary proportionally to the input voltage variation. The output current variation is β times the input current variation. Therefore, the voltage gain is β times the ratio of the load impedance to the input impedance. The sum of the two collector currents is almost constant due to the current source. The differential to single-ended converter thus also acts as an amplifier.

When the total gain is high enough and the output of either transistors T1 and T2 is saturated, the differential pair 16 could be approximate to a sign detector. At values greater than zero, the analog input signal received at the base of transistor T1 is large enough to cause the voltage between the base and emitter of the transistor T1 to exceed a threshold voltage, causing current to flow through the collector of the transistor T1. A positive analog input value causes a negative voltage to be applied to the base of the transistor T2. When the input voltage to transistor T2 falls below the threshold voltage, the transistor T2 is in the cutoff mode, and no current flows through the transistor T2 or through the transistor T4. If, however, the analog input value is negative, the transistor T1 is in the cutoff mode (i.e., no current flows through the transistors T1 and T3), and a positive voltage is applied to the base of the transistor T2. If the positive voltage exceeds the threshold voltage of the transistor T2, a current flows through the collectors of the transistors T2 and T4. At any given time, the current flowing through the transistors T1 and T3 may be larger than that flowing through the transistors T2 and T4 or vice versa. Thus a flow of current through the transistors T1 and T3 that is greater than a flow of current through the transistors T2 and T4 indicates a positive analog input voltage, and a flow of current through the transistors T2 and T4 that is greater than a flow of current through the transistors T1 and T3 indicates a negative analog input voltage. The differential to single-ended comparator 32 determines whether more current is flowing through transistors T1 and T3 or through the transistors T2 and T4 and selects the value of the sign bit to be either "1" or "0" based on the determination. For example, if the differential to single-ended converter detects more current flowing through the transistors T1 and T3, it produces a sign bit of "0" to signify that the analog input is positive. Conversely, if the differential to single-ended comparator 32 detects more current flowing through the transistors T2 and T4, it produces a sign bit equal to "1" to signify that the analog input is negative. In some embodiments, the differential to single-ended comparator 32 determines whether a voltage drop has occurred across the resistor R1 (caused by current flowing through transistors T1 and T3) or across the resistor R2 (caused by current flowing through transistors T2 and T4). In some embodiments, the differential to single-ended comparator 32 produces a sign bit of "0" to represent a negative analog input and a sign bit of "1" to represent a positive analog input.

The magnitude of the analog input is controlled at output pin 34a by the transistors T1 and T2 and at output pin 34b by the transistors T5 and T6. The transistors T7 and T8 buffer the signals before they are transmitted through the output pins 34a and 34b. The signals produced at the output pins 34a and 34b are complementary signals that are out of phase by 180 degrees. The transistors T1, T2, T5, and T6 are each arranged in a configuration referred to as an "emitter follower" configuration. In an emitter follower configuration, the input signal is applied to the base and the output signal is taken from the emitter. The ratio of the voltage at the emitter to the voltage at the base closely approaches unity, which means that the signal at the emitter closely follows that at the base. The process by which the magnitude of the analog input is generated by the transistors T1 and T2 at the output pin 34a and by the transistors T5 and T6 at the output pin 34b is described in further detail with respect to FIG. 3.

The transistors T1 and T2 are biased with a constant-current source 28b having a high output impedance. An optional resistor R3 is provided to introduce a DC offset if needed. The value of R3 is usually small compared with the current source so the signal loss is negligible. The collector currents of the transistors T1 and T2 are received at the emitters of T3 and T4, respectively. The current at each of the collectors of the transistors T1 and T2 are approximately equal to the current at each of their respective bases multiplied by a gain factor β which is approximately between 100 and 300. The load resistances seen by the transistors T1 and T2 are the input resistances at the emitters of transistors T3 and T4. The low load resistance seen by the transistors T1 and T2 considerably reduces the Miller effect (also referred to as the Muller effect) of parasitic capacitances between their bases and collectors. The Miller effect is defined below.

The following discusses in further detail how the transistors T3 and T4 reduce the Miller effect in the transistors T1 and T2. If, for example, the transistor T3 were omitted from the differential pair 16, the collector of the transistor T1 would be connected directly to the resistor R1. When the voltage at the base of the transistor T1 increases, the current through the base is amplified in proportion to the base current by gain factor β, as discussed above. As the collector current through the transistor T1 increases with the base current, the voltage drop across the resistor R1, which is equal to the collector current multiplied by the resistance value of R1, also increases. Because there is a parasitic capacitance between the collector and base of the transistor T1, a change in voltage across the resistor R1 causes the voltage at the base of the transistor T1 to change as well. Namely, a drop in voltage across the resistor R1 causes the voltage at the base of the transistor T1 to drop. Because the voltages at either side of the parasitic capacitance are in a ratio approximately equal to the gain factor β, the parasitic capacitance is effectively increased by the gain factor β as well. This phenomena is referred to as the Miller effect. Higher signal frequencies increase the effect of the parasitic capacitance, causing an effective short circuit between the base and the collector. This in turn degrades the accuracy with which the emitter voltage of transistor T1 follows the base voltage, which ultimately leads to poor performance of the differential pair 16. Similarly, if transistor T4 were omitted from the differential pair 16, the performance of transistor T2 at high frequencies would be impaired due to the Miller effect.

The addition of the transistor T3 between the transistor T1 and the resistor R1, and, similarly, the addition of the transistor T4 between the transistor T2 and the resistor R2 prevents a voltage drop across the resistors R1 and R2 from affecting the base voltages of the transistors T1 and T2, respectively. Because the base voltages of the transistors T3 and T4 are fixed, neither of those transistors experiences the Miller effect. The transistors T3 and T4 essentially act as current buffers that isolate the voltage changes across the resistors R1 and R2. The transistors T3 and T4 pass the signal current to the differential to single-ended comparator 32, while presenting low load resistances to the amplifying transistors T1 and T2. The collectors of the transistors T3 and T4 carry currents that are almost equal to the currents at the collectors of the transistors T1 and T2, respectively.

The voltage followers 18 and 20 are coupled, respectively, to the output pins 34a and 34b. The signals produced at the output pints 34a and 34b are complementary signals that are out of phase by 180 degrees. Voltage followers 18 and 20 are implemented by the transistors T8 and T7, respectively, both arranged in an emitter-follower configuration. These two transistors provide a differential output if both are used or a single-ended output if one of them is used. Although the transistor T8 is pnp and the transistor T7 is npn, their functions are essentially the same. The voltage followers 18 and 20 exhibit a voltage gain that is smaller but close to unity, a high input resistance, and a low output resistance. The voltage followers 18 and 20 are included as the last stages of the differential stage 12 to provide a low output resistance. A low output impedance enables sufficient current to be provided to the ADC 14, also referred to as the "load".

The current sources 28 may be implemented using a variety of known circuits that include, for example, BJT transistors, MOS (metal-oxide semiconductor) transistors, operational amplifiers, diodes, and resistors. Examples of circuits for implementing the current sources 28 may include, but are not limited to, basic current mirrors, cascode current mirrors, Wilson current mirrors, and any combination thereof.

Figure 3:
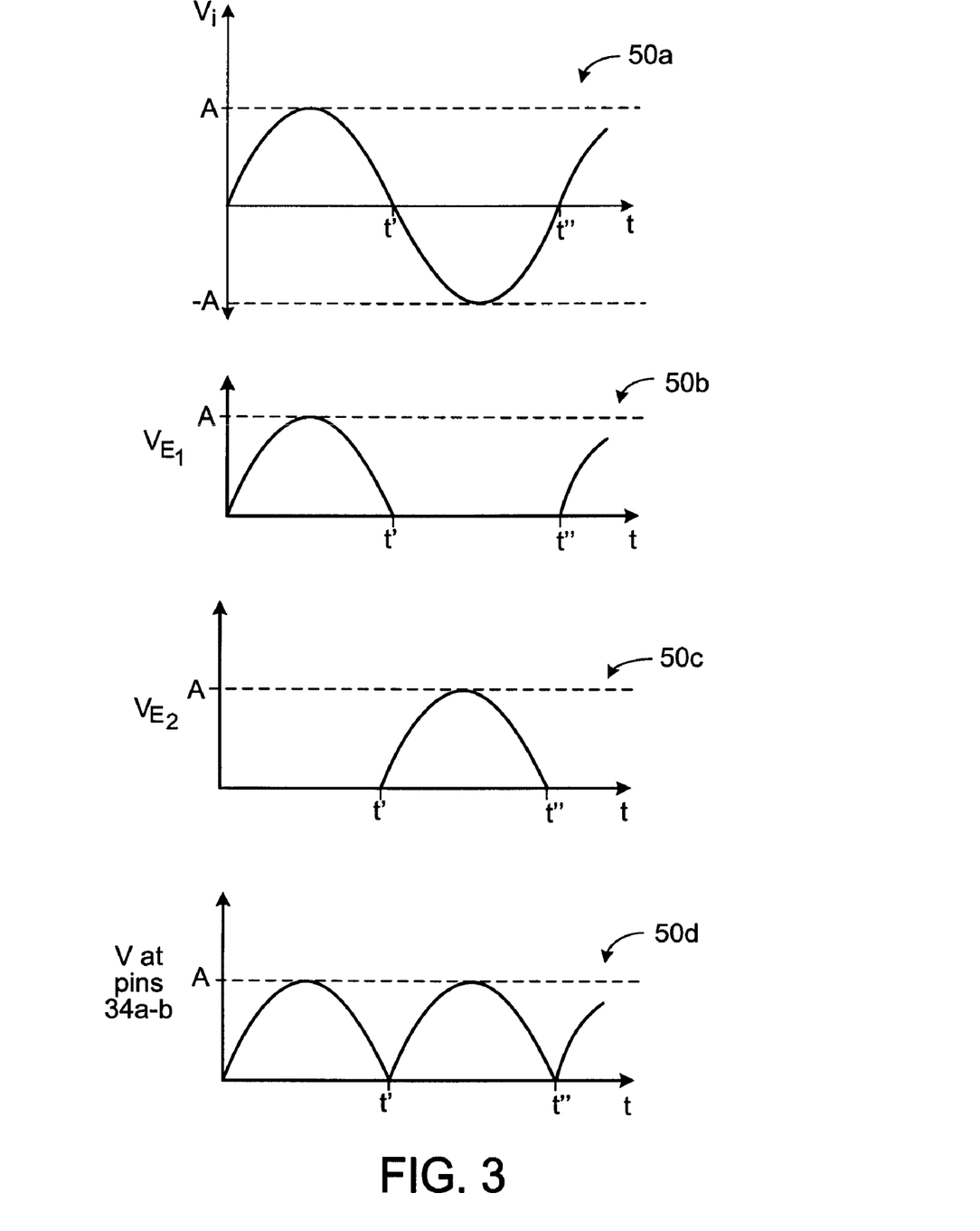
FIG. 3 shows a plot of waveform generated at an output of the external differential stage shown in FIG. 2.

FIG. 3 shows plots 50a–d of the signals produced at key points in the differential stage 12. Plots 50b–c shows the signals at the emitters of the transistors T1 and T2 given a sinusoidal analog input shown in the plot 50a. The plot 50d shows the signal at the output pins 34a–b that is received by the ADC 14.

As seen in the plots 50a–c, when the analog input voltage is positive, the voltage at the emitter of the transistor T1 (labeled $V_{E1}$ in FIG. 3) follows the voltage applied to its base (i.e., the analog input voltage a signal level greater than a predetermined threshold over $V_i$). The transistor T2, however, is in the cutoff mode when the input voltage is positive, and therefore the voltage at the emitter of transistor T2 (labeled $V_{E2}$ in FIG. 3) is zero. Conversely, when the analog input voltage is negative, a voltage that is equal and opposite to the analog input voltage is applied to the base of the transistor T2, and the voltage $V_{E2}$ follows that voltage. The transistor T1 is in the cutoff mode when the analog input voltage is negative, and thus the voltage $V_{E1}$ is zero. As the input signal switches between positive and negative voltages, the transistors T1 and T2 switch between active and cutoff modes such that the transistor T1 is in the active mode when the transistor T2 is in cutoff and vice versa. Voltage change is performed quickly without interfering with base voltages at the transistors T1 and T2. As soon as the input voltage changes from positive to negative, or vice versa, the voltages at the emitters of the transistors T1 and T2 change quickly due to the current source 28b. Because the emitters of the transistors T1 and T2 are tied together, the currents flowing through the transistors T1 and T2 share the same path. Therefore, the signal received by the ADC 14, after passing through the voltage buffer 18, is equal to the sum of the voltages $V_{E1}$ and $V_{E2}$. A comparison of the plots 50a and 50d reveals that the input to the ADC 14 (labeled "V at pins 34a–b" in FIG. 3) is approximately equal to the absolute value of the input voltage.

The transistors T5 and T6 of voltage buffer stage 22 are essentially the same as the transistors T1 and T2 except that because they are pnp, rather than npn. Therefore, the voltage polarities and current flow of the transistors T5 and T6 in the active mode are the reverse of that for the transistors T1 and T2. Similar to the resistor R3, the resistor R4 may optionally be used to increase the input resistance of the transistors T5 and T6 and to adjust the overall voltage gain between the collector and the base of each of the transistors T5 and T6. The signals produced at the emitters of the transistors T5 and T6 in relation to a sinusoidal input voltages are essentially the same as those shown in plots 50b and 50c in relation to transistors T1 and T2. Furthermore, the signal produced at output pin 34b, after passing though the voltage buffer 20 is approximately equal to the absolute value of the input voltage and exhibits a waveform akin to that shown in plot 50d, except for that it is out of phase by 180 degrees.

Figure 4:
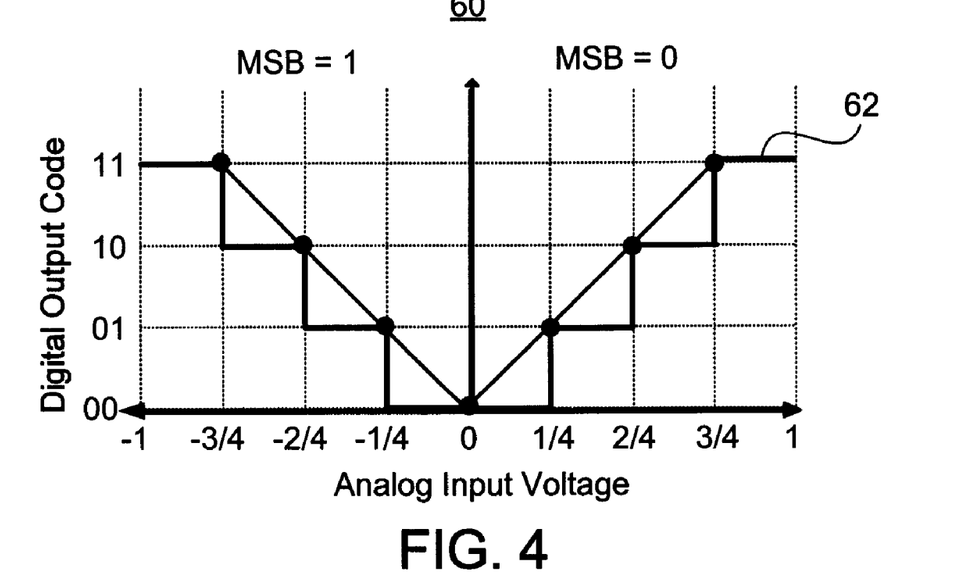
FIG. 4 shows a plot of an exemplary ideal transfer function of the composite ADC shown in FIG. 2.

FIG. 4 shows a plot 60 of an ideal transfer function 62 of the composite ADC 10 that has the same dynamic range and resolution of a conventional ADC whose ideal transfer function 4 is shown in FIG. 1. Because the differential stage 12 provides the sign bit, the dynamic range of the ADC 14 can be half of that of the conventional ADC yet the composite ADC 10 will still exhibit the same dynamic range as that of the conventional ADC. In the example shown in FIG. 4, the code width of ADC 14 has been reduced from three bits to two bits.

Figure 5:
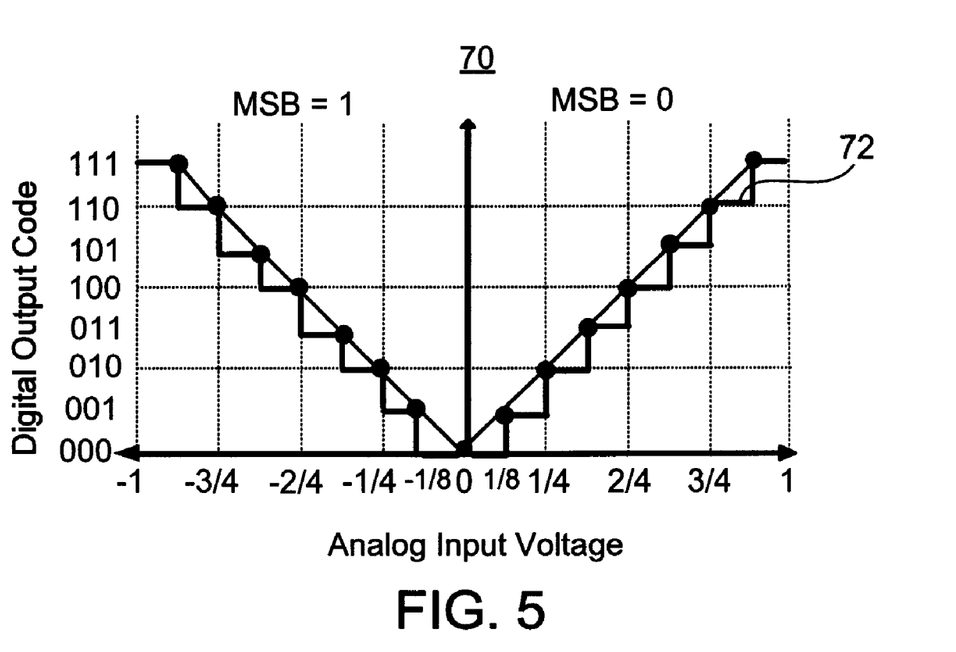
FIG. 5 shows another exemplary ideal transfer function of the composite ADC shown in FIG. 2.

FIG. 5 shows a plot 70 of an ideal transfer function 72 of the composite ADC 10 having a dynamic range that is the same as that of a conventional ADC whose ideal transfer function 4 is shown in FIG. 1. However, the composite ADC 10 has twice the resolution of the conventional ADC. The code-width of the ADC 14 is the same as that of the conventional ADC, but because the ADC 14 converts only positive values, the codes that the conventional ADC uses to represent negative numbers can now be used in the ADC 14 to improve the resolution with which it represents positive values. In the example shown in FIG. 5, the resolution of the composite ADC 10 is $V_{ref}/8$, which is twice that of the conventional ADC, which has a resolution of $V_{ref}/4$ (see FIG. 1).

The circuitry described herein, including the differential pair 16, the voltage followers 22, 18, and 20, the ADC 14, differential to single-ended comparator 32, processor 26, and/or portions thereof, may be implemented as part of composite ADC 10 or as separate circuitry for use in conjunction with composite ADC 10.

A number of embodiments of the invention have been described. Nevertheless, it will be understood that various modifications may be made without departing from the spirit and scope of the invention. For example, another differential stage, similar to the differential stage 12 could be coupled to the input ADC 10, which includes the differential stage 12 coupled to the input of ADC 14. Similarly, any number of differential stages 12 could be cascaded together and coupled to the input of the ADC 10. The ADC 10 could have a unipolar output or bipolar outputs.

In some embodiments, some or all of the BJT transistors could be replaced with metal-oxide-semiconductor (MOS) transistors or other types of transistors. Any number of bypass capacitors and other biasing circuitry could be included in the differential stage 12. The transistors T1 and T3 could be arranged in a folded cascade configuration. Likewise, transistors T2 and T4 could be arranged in a folded cascade configuration. One or more of the resistors R1, R2, R3, and R4 could be replaced with transistors configured to operate as resistors.

The conversion process performed by the composite ADC 10 is not limited to use with the hardware described herein. The conversion process can be implemented, at least in part, in digital electronic circuitry, or in computer hardware, firmware, software, or in combinations thereof.

The conversion process can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with implementing the conversion process can be performed by one or more programmable processors executing one or more computer programs to perform the functions of the processes. All or part of the conversion process can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

Accordingly, other embodiments are within the scope of the following claims.

What is claimed is:

1. A system for converting an analog input signal to a first digital code, the system comprising:
 a differential stage to:
  produce a sign bit indicative of a sign of the analog input signal;
  and
  to generate a first analog signal that is approximately equal to an absolute value of the analog input signal;

an analog-to-digital converter (ADC) to convert the first analog signal to a second digital code representing a magnitude of the analog input signal; and a controller to combine the second digital code and the sign bit to produce the first digital code.

2. The system of claim 1, wherein:
the sign bit is a most significant bit of the first digital code; and
the first digital code can represent both positive and negative values of the analog input signal.

3. The system of claim 2, wherein the first digital code is one of a one's complement representation and a two's complement representation.

4. A system for converting an analog input signal to a first digital code, the system comprising:
a differential stage to:
produce a sign bit indicative of a sign of the analog input signal; and
to generate a first analog signal that is approximately equal to an absolute value of the analog input signal;
an analog-to-digital converter (ADC) to convert the first analog signal to a second digital code representing a magnitude of the analog input signal; and
a controller to combine the second digital code and the sign bit to produce the first digital code, wherein the differential stage comprises:
a differential pair comprising:
a first transistor having a base, a collector, and an emitter, wherein a first applied voltage that is substantially equal to the analog input signal is applied to the base, and the collector is configured to conduct current when the first applied voltage is greater than a threshold voltage;
a second transistor having a base, a collector, and an emitter, wherein a second applied voltage that is substantially equal in magnitude and opposite in sign to the analog input signal is applied to the base of the second transistor, and that collector of second transistor is configured to conduct current when the second applied voltage is greater than the threshold voltage, wherein a sum of currents conducted by the collectors of the first and second transistors is constant; and
a differential to single-ended converter to select a value of the sign bit in response to detecting a current flowing through one of the collectors of the first and second transistors.

5. The system of claim 4, wherein the differential to single-ended converter is configured to:
select the value of the sign but to indicate that the analog input signal is positive in response to detecting a current flowing through the collector of the first transistor; and select the value of the sign bit to indicate that the analog input signal is negative in response to detecting a current flowing through the collector of the second transistor.

6. The system of claim 4, wherein the threshold voltage is zero.

7. The system of claim 4, wherein the emitter of the first transistor produces a voltage that follows the first applied voltage when the collector of the transistor conducts current.

8. The system of claim 4, wherein the emitter of the second transistor produces a voltage that follows the second applied voltage when the collector of the second transistor conducts current.

9. The system of claim 4 wherein:
the emitters of the first and second transistors are connected at a node that carries the first analog signal that is approximately equal to the absolute value of the analog input signal, wherein the first analog signal comprises voltages produced at the emitters of the first and second transistors.

10. The system of claim 4, further comprising:
a third transistor configured to reduce a Miller effect of a parasitic capacitance between the base and the collector of the first transistor; and
a fourth transistor configured to reduce a Miller effect of a parasitic capacitance between the base and the collector of the second transistor.

11. The system of claim 4, wherein:
the third transistor has a base to receive a fixed voltage, a collector coupled to a voltage supply, and an emitter connected to the collector of the first transistor;
the fourth transistor has a base to receive a fixed voltage, a collector couple to the voltage supply, and an emitter connected to the collector of the second transistor.

12. The system of claim 1, further comprising:
a voltage buffer coupled between the differential stage and the ADC, wherein the voltage buffer is configured to provide an output impedance that is less than an input impedance of the ADC.

13. The system of claim 4, further comprising a current source coupled to the emitters of the first and second transistors, wherein the current source comprises a current mirror.

14. A method for converting an analog input signal to a first digital code, the method comprising:
producing a sign bit indicative of the sign of the analog input signal, using a differential stage;
generating a first analog signal that is approximately equal to the absolute value of the analog input signal;
converting the first analog signal to a second digital code representing the magnitude of the analog input signal, using an analog-to-digital converter (ADC); and
combining the second digital code and the sign bit to produce the first digital code, using a controller coupled to the differential stage and the ADC.

15. A method for converting an analog input signal to a first digital code, the method comprising:
producing a sign bit indicative of the sign of the analog input signal, using a differential stage;
generating a first analog signal that is approximately equal to the absolute value of the analog input signal;
converting the first analog signal to a second digital code representing the magnitude of the analog input signal, using an analog-to-digital converter (ADC); and
combining the second digital code and the sign bit to produce the first digital code, using a controller coupled to the differential stage and the ADC, wherein the differential stage comprises:
a differential pair comprising:
a first transistor having a base, collector, and an emitter, wherein a first applied voltage that is substantially equal to the analog input signal is applied to the base, and the collector is configured to conduct current when the first applied voltage is greater than a threshold voltage;
a second transistor having a base, a collector, and an emitter, wherein a second applied voltage that is substantially equal in magnitude and opposite in sign to the analog input signal is applied to the base of the second transistor, and the collector of second transistor is configured to conduct current when the second applied voltage is greater than the threshold voltage, wherein a sum of currents conducted by the collectors of the first and second transistors is constant; and a differential to single-ended converter to select a value of the sign bit in response to detecting a current flowing through one of the collectors of the first and second transistors.

16. The method of claim 15, wherein producing a sign bit indicative of the sign of the analog input signal comprises configuring the differential to single-ended converter to:

select the value of the sign bit to indicate that the analog input signal is positive in response to detecting a current flowing through the collector of the first transistor; and select the value of the sign bit to indicate that the analog input signal is negative in response to detecting a current flowing through the collector of the second transistor.

17. The method of claim 14, further comprising selecting the threshold voltage to be zero.

18. The method of claim 15, wherein generating a first analog signal that is approximately equal to the absolute value of the analog input signal further comprises:

connecting the emitters of the first and second transistors to a node that carries the first analog signal that is approximately equal to the absolute value of the analog input signal, wherein the first analog signal comprises voltages produced at the emitters of the first and second transistors.

19. A system for providing an additional bit to an analog-to-digital converter (ADC), the system comprising:

a first transistor having a base to receive a first applied voltage that is substantially equal to the analog input signal, a collector to conduct current when the first applied voltage is greater than a threshold voltage, and an emitter to produce a voltage that follows the first applied voltage when the collector of the first transistor conducts current;

a second transistor having a base to receive a second applied voltage that is substantially equal in magnitude and opposite in sign to the analog input signal, a collector configured to conduct current when the second applied voltage is greater than the threshold voltage, and an emitter to produce a voltage that follows the second applied voltage when the collector of the second transistor conducts current;

a differential to single-ended converter to:

select a value of a sign bit to indicate that the analog input signal is positive in response to detecting a current flowing through the collector of the first transistor; and select the value of the sign bit to indicate that the analog input signal is negative in response to detecting a current flowing through the collector of the second transistor;

wherein the emitters of the first and second transistors are connected at a node that carries a second analog signal that is approximately equal to an absolute value of the analog input signal, and wherein the second analog signal comprises voltages produced at the emitters of the first and second transistors;

a third transistor to reduce a Miller effect of a parasitic capacitance between the base and the collector of the first transistor, wherein the third transistor has a base to receive a fixed voltage, a collector coupled to a voltage supply, and an emitter connected to the collector of the first transistor; and a fourth transistor to reduce a Miller effect of a parasitic capacitance between the base and the collector of the second transistor, wherein the fourth transistor has a base to receive a fixed voltage, a collector coupled to the voltage supply, and an emitter connected to the collector of the second transistor.

20. The system of claim 19, wherein the threshold voltage is zero.

* * * * *